(12) United States Patent
Walters, Jr.

(10) Patent No.: US 6,360,347 B1
(45) Date of Patent: Mar. 19, 2002

(54) ERROR CORRECTION METHOD FOR A MEMORY DEVICE

(75) Inventor: Donald Monroe Walters, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/314,576

(22) Filed: May 18, 1999

(51) Int. Cl.[7] .......................... G11C 29/00; H03M 13/00
(52) U.S. Cl. ................ 714/763; 714/719; 714/762; 714/773; 714/777; 714/785; 714/805; 365/189.05; 365/200
(58) Field of Search .................... 714/42, 701, 704, 714/712, 719, 720, 721, 746, 762, 763, 771, 772, 773, 777, 784, 785, 805

(56) References Cited

U.S. PATENT DOCUMENTS

| 5,313,464 A | * | 5/1994 | Reiff | ........................ 714/701 |
| 5,416,782 A | * | 5/1995 | Wells et al. | ................. 714/719 |
| 5,438,577 A | * | 8/1995 | Nakase et al. | .............. 714/785 |
| 5,566,194 A | * | 10/1996 | Wells et al. | ................. 714/805 |
| 5,604,703 A | * | 2/1997 | Nagashima | ................. 365/200 |
| 5,933,436 A | | 8/1999 | Kazunori et al. | ........... 714/762 |

FOREIGN PATENT DOCUMENTS

| EP | 0 448 970 A | 2/1991 |
| JP | 08 255111 A | 1/1996 |

* cited by examiner

Primary Examiner—Emmanuel L. Moise
(74) Attorney, Agent, or Firm—Fliesler Dubb Meyer & Lovejoy, LLP (57) ABSTRACT

An error correction method for data bytes in a memory uses an error correcting block code such as a Hamming code to detect and correct errors, if any, in the data bytes. The error correction method can be performed by relatively simple and inexpensive logic circuitry while improving the speed of error correction to reduce delays in the external data access time.

40 Claims, 5 Drawing Sheets

ERROR CORRECTION METHOD FOR A MEMORY DEVICE

TECHNICAL FIELD

The present invention relates to error correction of data in a memory device, and more particularly, to an error correction method for a non-volatile memory device.

BACKGROUND ART

In semiconductor integrated memory devices, such as non-volatile memory devices, errors sometimes occur when data are written to or read from the memory devices. Sometimes errors in data storage may occur due to the physical characteristics of the memory devices. For example, in a conventional flash memory device, errors in the data stored in the flash memory may be caused by manufacturing defects or program disturbances. A program disturbance may be caused by an undesirable field turn-on in a typical conventional flash memory array during the programming of the memory gates in the conventional flash memory array. A field turn-on in the substrate region under the select gate transistor field oxide region between two memory gates on adjacent bit lines may cause one of the memory gates which is supposed to be in a program-inhibited state indicating a logic bit "1" to be "turned on" to a programmed state indicating a logic bit "0". Bit errors in the data stored in a conventional non-volatile memory device may also be caused by various other factors.

In order to provide an acceptable level of reliability of data read from a conventional flash memory array, error correcting codes have been integrated into memory storage systems to correct bit errors in the data stored in the memory. Conventional error correcting codes such as block codes have been used in the error correction of data in conventional memory storage systems. For example, Hamming codes, which are within a class of conventional block codes well known to a person skilled in the art, have been used to provide single-bit error correction to preserve the accuracy of data in conventional memory storage devices.

Error checking and correction of data read from a flash memory array cause a delay from the time the data are pre-read from the memory by an error correction circuit to the time the error correction circuit enables the corrected data to be accessed externally by a host system. In order to minimize the time delay, error correction circuits have been implemented to compute the error addresses, that is, the syndrome generated by the error correcting block code, by parallel processing of the data read from the memory device. However, conventional error correction circuits with parallel processing capabilities can be very expensive to implement because of the complexity of the hardware. Parallel processing of data in the computation of the error addresses requires a large number of logic gates. For example, for every 1,000 bits of data read from the conventional flash memory device, approximately 5,000 XOR gates may be required for the parallel processing of data to minimize the delay in computing the syndrome.

Some applications may require that the cost of the memory storage system be minimized rather than the delay from the time of pre-reading the data from the memory array by the error correction circuit to the time the error correction circuit enables the corrected data to be read externally. In order to minimize the hardware cost, conventional error correction circuits and the methods have been implemented which involve serial processing of the data stored in the memory array to generate error addresses based upon a conventional error correcting block code. However, conventional serial processing may require hundreds of clock cycles of delay in the data access time before the data are read by the host system. A long time delay caused by the serial processing of the data may be unacceptable in some applications.

Therefore, there is a need for an error correction circuit and a method of error correction which are capable of reducing the cost of the hardware required for computing the error addresses compared to the hardware costs associated with the conventional parallel processing of the data read from the memory device, while reducing the data access time delay compared to the relatively long time delays resulting from the conventional serial processing of the data to generate the error addresses. Furthermore, there is a need for a method of allocating data words and error correction bytes in a page of memory to allow for efficient error correction while reducing the hardware cost.

DISCLOSURE OF THE INVENTION

The present invention satisfies these needs. In accordance with the present invention, a method of correcting an error in a memory device generally comprises the steps of:

(a) pre-reading a data word comprising a plurality of bytes identified by a plurality of data word byte addresses, comprising the step of counting the bytes of the data word to generate a plurality of byte ordinals for the bytes in the data word;

(b) coding the data word to generate a code word;

(c) generating a syndrome based upon the code word, the byte ordinals and the data word, the syndrome comprising a byte error address and a bit error address;

(d) comparing the data word byte address with the byte error address to determine whether the data word byte address matches the byte error address;

(e) generating an error correction enable signal in response to a determination by the step of comparing the data word byte address with the byte error address that the data word byte address matches the byte error address;

(f) decoding the bit error address to generate a decoded bit error address; and (g) generating an error corrected byte based upon the decoded bit error address in response to the error correction enable signal.

In an embodiment in which each memory page comprises a plurality of data words including first and second data words, the error correction method further comprises the steps of pre-reading the second data word by an error correction circuit when the first data word is being read by the memory, and coding the second data word to generate a code word for the second data word when the first data word is being corrected and read.

In an embodiment, each memory page comprises three groups of data words. The first group comprises 10 data words each comprising 20 bytes. The second group comprises 13 data words each comprising 24 bytes. The last group comprises a single word having 16 bytes.

The steps of correcting errors in a data word as described above can be repeated for correcting errors, if any, in a plurality of data words within a page of memory. For error correction of data bytes in a memory array capable of storing a plurality of memory pages each comprising a plurality of data words, the method steps may be further repeated to correct errors, if any, in all of the data words within the memory pages. In an embodiment, each of the data words is coded by using a conventional error correcting block code, and in a further embodiment, the block code used for error correction comprises a conventional Hamming code.

In an embodiment, the syndrome generated by the error correcting code is an 8-bit syndrome byte which comprises a byte error address consisting of five bits and a bit error address consisting of three bits. The byte error address may be the higher order bits of the syndrome byte while the bit error address may be the lower order bits of the syndrome byte.

In an embodiment, the byte ordinals generated by the step of pre-reading the data word are represented in a binary format comprising a plurality of counter bits, at least two of the counter bits having a binary 1. In a further embodiment, the step of pre-reading the data word further comprises the step of rearranging the byte ordinals into a plurality of even bytes and a plurality of odd bytes. For example, for a data word which comprises a maximum of 26 data bytes, the renumbered byte ordinals for each of the data bytes within the data word may be represented as five counter bits, with at least two of the five counter bits having a binary 1. Furthermore, the byte ordinals may be renumbered and rearranged into odd bytes and even bytes, with the counter bits of the even bytes represented in a 5-bit binary format and the counter bits of the odd bytes represented in a 4-bit binary format.

Advantageously, the method of error correction according to the present invention is capable of reducing the delay in the external data access time compared to conventional serial processing methods for error correction in a memory device. Instead of requiring hundreds of cycles of delay in the data access time resulting from the conventional serial processing of the data in a conventional error correction circuit, the method of error correction according to the present invention is able to reduce the delay in the external data access time for each memory page. A further advantage of the present invention is that it is able to reduce the cost of the memory hardware by reducing the number of logic gates required for the conventional parallel processing of the data for error correction. Therefore, the error correction method according to the present invention is able to correct data errors more efficiently than conventional serial processing while allowing for a simpler and less expensive hardware structure than that required for conventional parallel processing.

BRIEF DESCRIPTION OF THE DRAWINGS

The present invention will be described with respect to particular embodiments thereof, and references will be made to the drawings in which.

MODES FOR CARRYING OUT THE INVENTION

Figure 1:
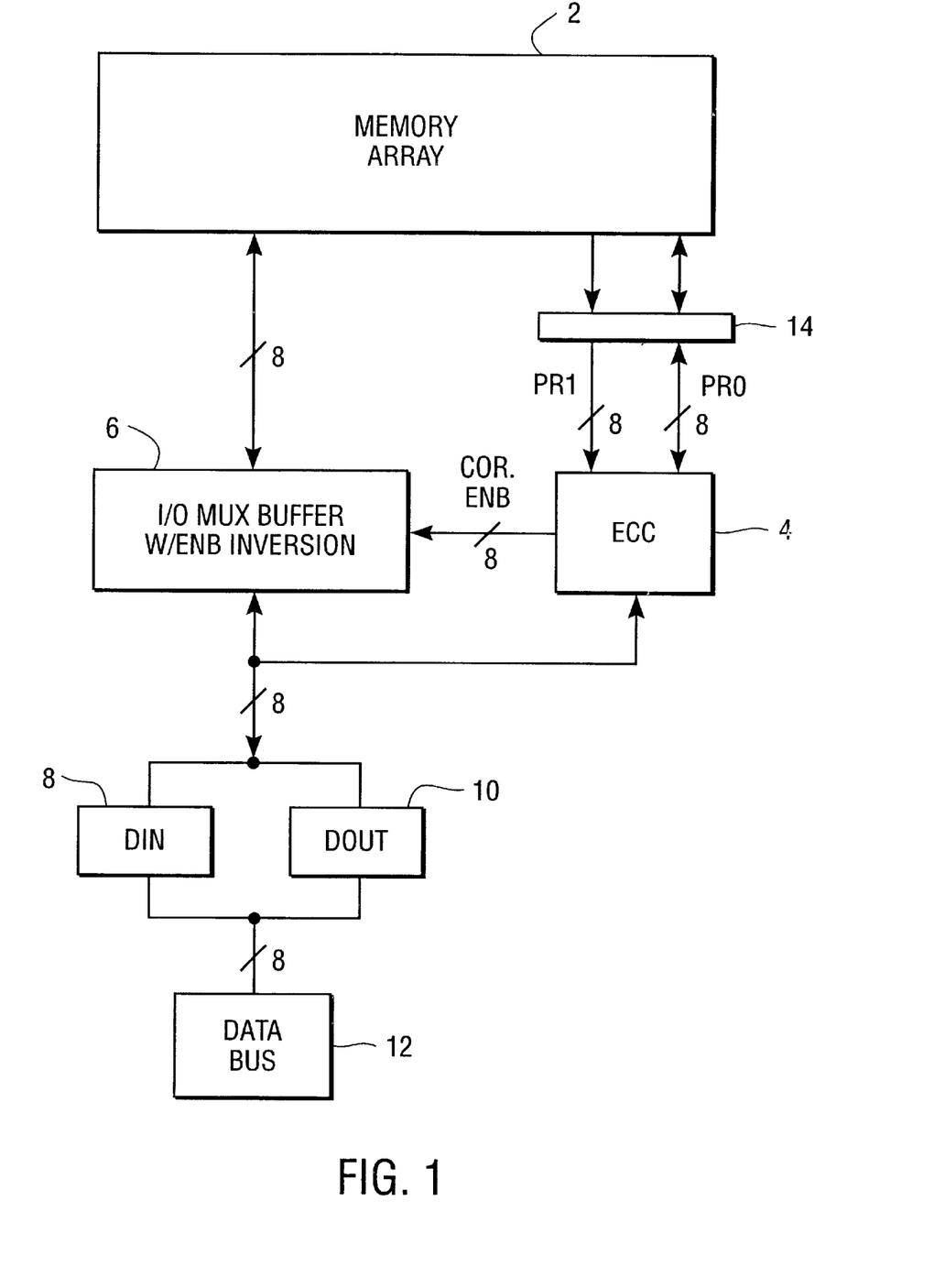
FIG. 1 shows an example of a simplified block diagram of a memory device with a memory array and an error correction circuit to which the method according to the present invention is applicable.

FIG. 1 shows a simplified block diagram of a memory device comprising a memory array 2 and an error correction circuit 4 in accordance with the present invention. The memory device further comprises an input-output multiplexer buffer 6 which is coupled to both the memory array 2 and the error correction circuit 4. Furthermore, a data input buffer 8 and a data output buffer 10 are coupled to the input-output multiplexer buffer 6 to transfer data which are to be written to and read from the memory array 2 through the input-output multiplexer 6, respectively. The data input and output buffers 8 and 10 are coupled to a data bus 12 which interfaces the memory array 2 with an external device or a host system for both read and write operations.

In an embodiment, the memory device according to the present invention further comprises a data pre-read input-output bus 14, coupled between the error correction circuit 4 and the memory array 2, to transfer the data bytes between the memory array 2 and the error correction circuit 4 during both reading and writing operations. In an embodiment, the input-output multiplexer buffer 6 is capable of inverting the correction bits received from the error correction circuit 4 upon detecting an error in a data word which is pre-read from the memory array 2 by the error correction circuit 4.

Figure 2:
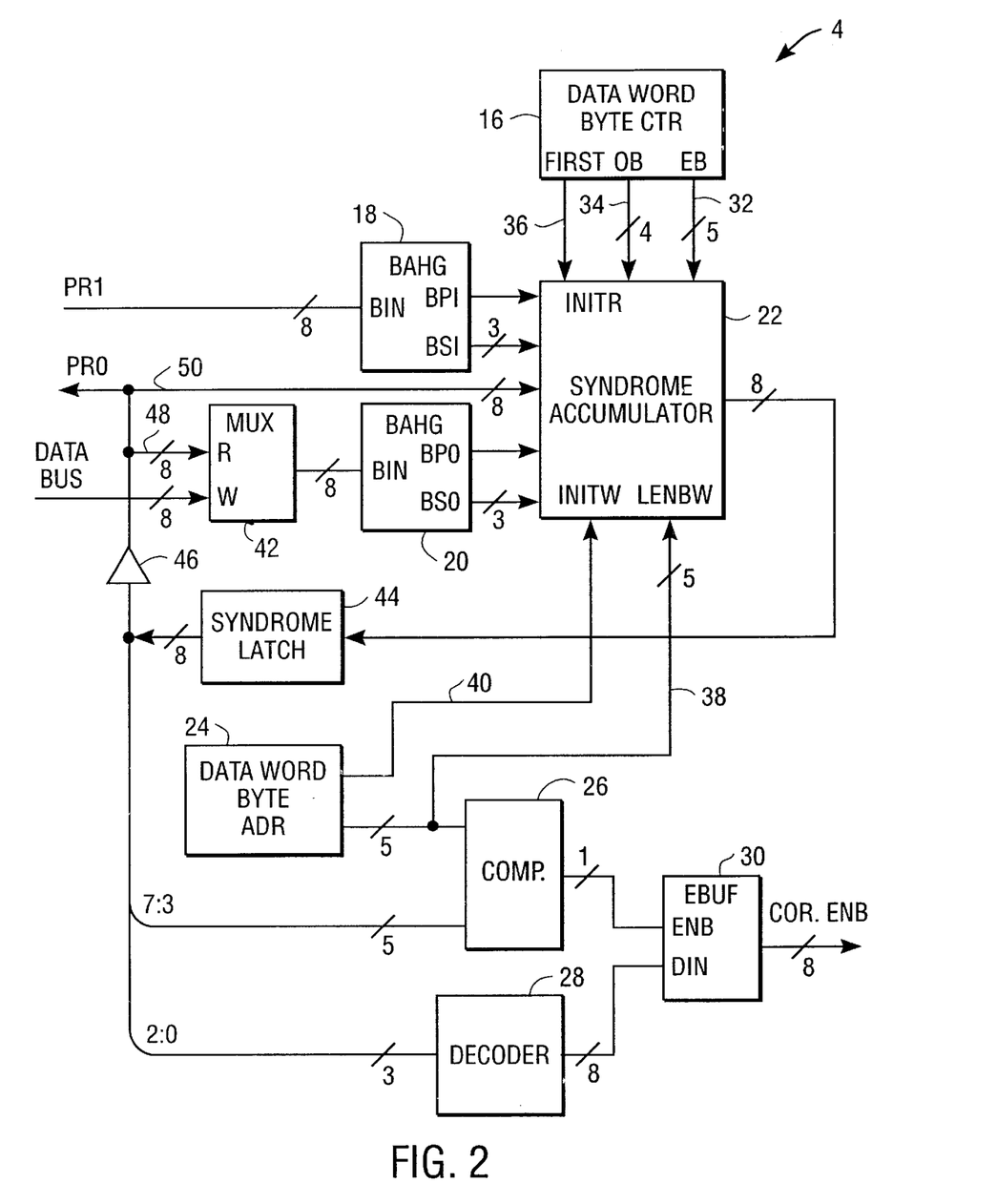
FIG. 2 shows a block diagram of an example of an error correction circuit to which the method according to the present invention is applicable.

FIG. 2 shows a block diagram of an embodiment of the error correction circuit 4 in accordance with the present invention. While the block diagram of FIG. 2 shows an embodiment with 8-bit error correction, the principles of the present invention is also applicable to 16-bit error correction. For example, the structure of FIG. 2 may be replicated for error correction of 16 bits of data at a time. The error correction circuit 4 comprises a data word byte counter 16, a first data encoder 18, a second data encoder 20, a syndrome accumulator 22, a data word byte address generator 24, a byte address comparator 26, a decoder 28, and an error correction enable buffer 30. The first and second data encoders 18 and 20 are capable of receiving first and second pre-read memory data, designated as PR1 and PR0, respectively. The first and second data encoders 18 and 20 generate first and second pluralities of coded bits denoted as BS1 and BS0, respectively, and first and second parity bits denoted as BP1 and BP0 for the convolutional operation in the syndrome accumulator.

Figure 3:
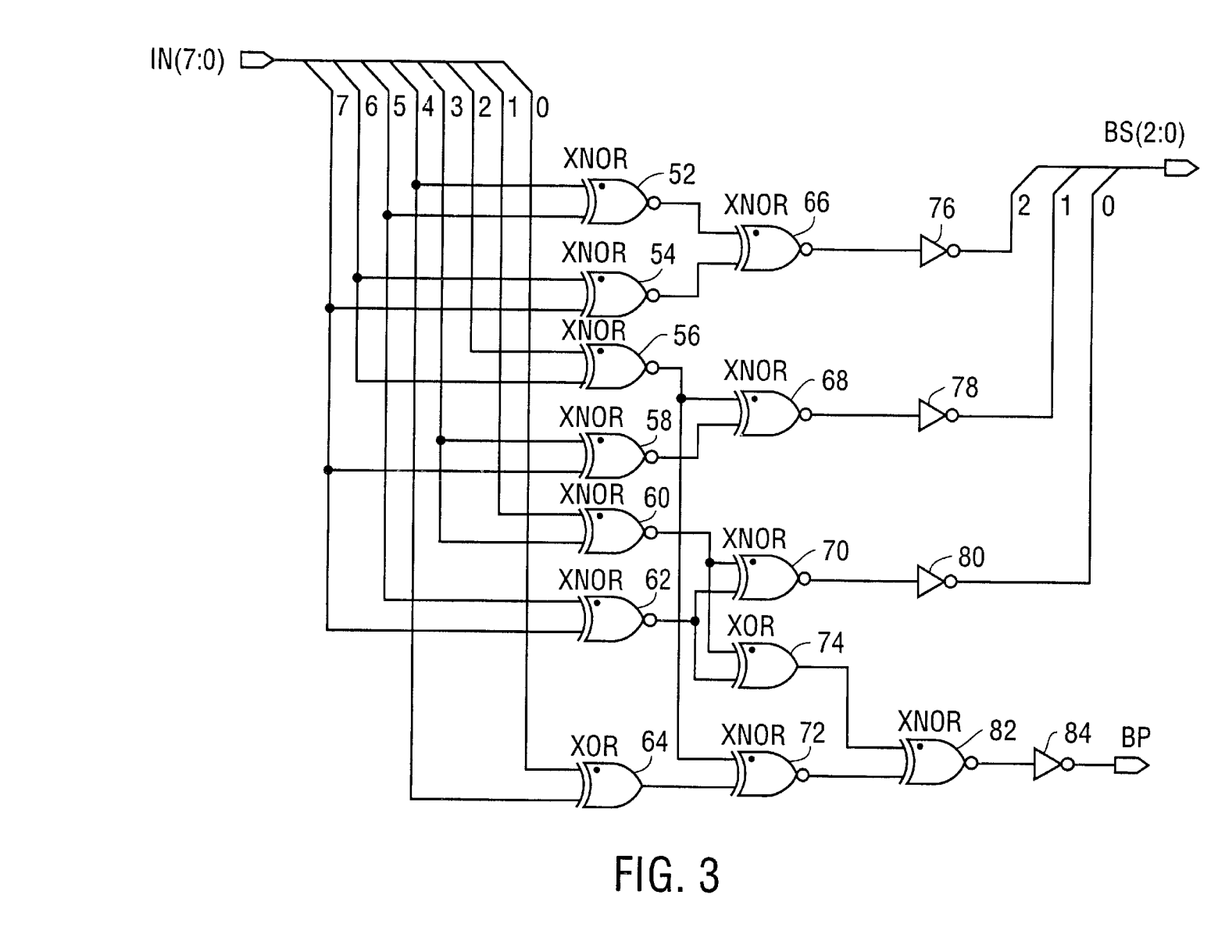
FIG. 3 shows a logic circuit diagram of a data encoder with a plurality of XNOR and XOR gates in the error correction circuit of FIG. 2.

In an embodiment, the first and second data encoders 18 and 20 comprise first and second block encoders, respectively, which encode the first and second pre-read memory data bytes by using a conventional block code. In a further embodiment, the block code used to encode the pre-read memory data bytes in the encoders 18 and 20 is a conventional Hamming code, which is well known to a person skilled in the art. An example of a bit address Hamming encoder for coding an 8-bit byte into three coded bits and an associated parity bit is shown in FIG. 3 and will be described in detail below.

Referring to FIG. 2, the data word byte counter 16, which is coupled to the syndrome accumulator 22, is capable of generating a plurality of odd byte ordinals and a plurality of even byte ordinals of a byte count. In an embodiment, the odd and even bytes of the byte count are generated by renumbering and rearranging the byte ordinals of the individual bytes within a given data word which is pre-read from the memory array. In a further embodiment, the renumbered and rearranged byte count comprises the plurality of counter bits, for example, five counter bits, which represent the renumbered and rearranged byte ordinals in a binary format.

In yet a further embodiment, the 5-bit binary representation of the byte ordinals are coded such that at least two of the counter bits have a binary number "1". An example of a listing of counter bits with a 5-bit binary representation of renumbered and rearranged byte ordinals of a 24-byte data word is shown in Table A below:

TABLE A

| Decimal Byte Ordinals | 5-Bit Binary Representation | | | | |
|---|---|---|---|---|---|
| 3  | 0 | 0 | 0 | 1 | 1 |
| 5  | 0 | 0 | 1 | 0 | 1 |
| 6  | 0 | 0 | 1 | 1 | 0 |
| 7  | 0 | 0 | 1 | 1 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 18 | 1 | 0 | 0 | 1 | 0 |
| 19 | 1 | 0 | 0 | 1 | 1 |
| 20 | 1 | 0 | 1 | 0 | 0 |
| 21 | 1 | 0 | 1 | 0 | 1 |
| 22 | 1 | 0 | 1 | 1 | 0 |
| 23 | 1 | 0 | 1 | 1 | 1 |
| 24 | 1 | 1 | 0 | 0 | 0 |
| 25 | 1 | 1 | 0 | 0 | 1 |
| 26 | 1 | 1 | 0 | 1 | 0 |
| 27 | 1 | 1 | 0 | 1 | 1 |
| 28 | 1 | 1 | 1 | 0 | 0 |
| 29 | 1 | 1 | 1 | 0 | 1 |
| 30 | 1 | 1 | 1 | 1 | 0 |
| 31 | 1 | 1 | 1 | 1 | 1 |

It is evident that this listing omits the decimal byte ordinals 0, 1, 2, 4, 8 and 16, each of which has less than 2 counter bits with a binary number "1" when the decimal byte ordinals converted into a binary format. Therefore, the maximum number of data bytes in a data word that can be represented by the byte ordinals in a format of 5 counter bits, with at least two of the counter bits having a binary "1", is 26 bytes. Furthermore, decimal byte ordinals 9 and 17 are omitted since a maximum of only 24 bytes are included in a data word in the embodiment described above. The byte ordinals 0, 1, 2, 4, 8 and 16 are skipped, and the decimal byte ordinals as listed in Table A are assigned to the twenty-six bytes of data in the data word. A listing of the decimal byte ordinals assigned to bytes 1–24 of a 24-byte data word, byte 1 being the first byte and byte 24 being the last byte in the data word, is shown in Table B below:

TABLE B

| Order of Byte in Data Word | Decimal Byte Ordinals |
|---|---|
| 1  | 3 |
| 2  | 5 |
| 3  | 6 |
| 4  | 7 |
| 5  | 10 |
| 6  | 11 |
| 7  | 12 |
| 8  | 13 |
| 9  | 14 |
| 10 | 15 |
| 11 | 18 |
| 12 | 19 |
| 13 | 20 |
| 14 | 21 |
| 15 | 22 |
| 16 | 23 |
| 17 | 24 |
| 18 | 25 |

TABLE B-continued

| Order of Byte in Data Word | Decimal Byte Ordinals |
|---|---|
| 19 | 26 |
| 20 | 27 |
| 21 | 28 |
| 22 | 29 |
| 23 | 30 |
| 24 | 31 |

The renumbering of the byte ordinals for the bytes in a data word is applicable to error corrections in both reading and writing operations. In a pre-reading operation, the data word byte counter 16 assigns the renumbered decimal byte ordinals as listed in Table B above to two groups, one group of even bytes and another group of odd bytes, as listed in Table C below:

TABLE C

| Data Word Byte Numbering | | |
|---|---|---|
| Pre-reading Channels: | Even | Odd |
| | 3 | 5 |
| | 6 | 7 |
| | 10 | 11 |
| | 12 | 13 |
| | 14 | 15 |
| | 18 | 19 |
| | 20 | 21 |
| | 22 | 23 |
| | 24 | 25 |
| | 26 | 27 |
| | 28 | 29 |
| | 30 | 31 |

In a further embodiment, the data word byte counter 16 is coupled to the syndrome accumulator 22 through a first channel 32 which is capable of transmitting five even bites, denoted as EB in FIG. 2, from the data word byte counter 16 to the syndrome accumulator 22. Furthermore, a second channel 34 is coupled between the data word byte counter 16 and the syndrome accumulator 22 to transfer the odd bytes, denoted as OB in FIG. 2, from the data word byte counter to the syndrome accumulator 22. Although both even and odd bytes of the renumbered byte ordinals are presented in a 5-bit binary format as shown in Table A above, the second channel 34 for the transmission of the odd bytes may have only four bits whereas the first channel 32 for the transmission of the even bits requires five bits. Referring to Table C above, all of the byte ordinals for the odd bytes have the least significant bit "1" when represented in a binary format. Therefore, the second channel 34 requires only four bits to transmit the byte ordinals of the odd bytes from the data word byte counter 16 to the syndrome accumulator 22.

Furthermore, in order to perform more efficient pre-reading operations by the error correction circuit according to the present invention, two data words may be coded simultaneously by the data encoders 18 and 20, and the bytes of the two data words may be counted by the data word byte counter 16. Each data page stored in the memory array 2 as shown in FIG. 1 may be arranged such that it comprises 24 data words arranged in three groups. The first group comprises 10 data words each having 20 data bytes, and the second group comprises 13 data words each having 24 data bytes. The last group contains a single word having 16 bytes.

In the embodiment shown in FIG. 2, the error correction circuit according to the present invention further comprises a third channel 36 coupled between the data word byte counter 16 and the syndrome accumulator 22. The third channel 36 is a one-bit data line which allows the data word byte counter 16 to initiate syndrome accumulation by the syndrome accumulator 22 in data reading mode.

The error correction circuit according to the present invention is not limited to performing the pre-reading operations on memory pages with a data word format as described above; other arrangements of the data words within a data page may also be used. In a further embodiment, the error correction circuit according to the present invention is further capable of data transfer during a page writing operation to the memory array. In this embodiment, the data word byte address generator 24 is capable of generating renumbered and rearranged byte ordinals for each of the bytes within a data word as listed in Table B above for the syndrome accumulator 22. The byte ordinals for a data word which is to be written to the memory array are represented in a 5-bit binary format and transmitted from the data word byte address generator 24 to the syndrome accumulator 22 through a 5-bit channel 38. Furthermore, the data word byte address generator 24 is further coupled to the syndrome accumulator 22 through a one-bit channel to initiate syndrome accumulation by the syndrome accumulator in data writing mode.

In a further embodiment, the error correction circuit according to the present invention further comprises a multiplexer 42 which is coupled between the second data encoder 20 and the data bus to generate a plurality of input bits for the second data encoder 20. Depending upon whether the memory array is in the read mode or the write mode, the multiplexer 42 generates either read or write data bytes for the data encoder 20 to generate the coded data bits BS0 and the associated parity bit BP0. Furthermore, the error correction circuit according to the present invention may further comprise a syndrome latch 44, coupled between the syndrome accumulator 22 and the comparator 26, to temporarily store the first and second pluralities of the syndrome bits generated by the syndrome accumulator 22.

In an embodiment in which the syndrome output from the syndrome accumulator 22 is an 8-bit byte, the syndrome latch 44 transmits the five higher order bits of the syndrome byte to the comparator 26 and the three lower order bits of the syndrome byte to the decoder 28. Furthermore, a buffer 46 is coupled between the syndrome latch 44 and the read input 48 of the multiplexer 42 to transmit the eight syndrome bits from the syndrome latch 44 to the read input R of the multiplexer 42. The buffer 46 transfers the bits from the syndrome latch 44 to the PR0 line in data writing mode.

The data word byte generator 24 generates a data word byte address for each of the bytes within each data word for both reading and writing operations. During the write operation, the data word byte address generator 24 signifies to the syndrome accumulator 22 to initiate the write operation and transfers the renumbered byte ordinals as the data word byte addresses in the 5-bit format to the syndrome accumulator 22 as described above. In the data reading mode in which data is read from the memory array, the data word byte address generator 24 transmits the data word byte address bits to the comparator 26, which is also coupled to receive the byte error address, that is, the five higher order bits of the syndrome byte from the syndrome latch 44. The comparator 26 compares the data word byte address from the data word byte address generator 24 with the byte error address from the syndrome latch 44 to determine whether the data word byte address matches the byte error address. If the data word byte address matches the byte error address, the comparator 26 generates an error correction enable signal, which is a one-bit signal, and transmits it to the correction enable buffer 30 to detect the error in the read data.

The bit error address, which comprises the three lower order bits of the syndrome byte, is transmitted to the decoder 28 which decodes the bit error address into an 8-bit format. The decoded bit error address is transferred from the decoder 28 to the data input $D_{IN}$ of the correction enable buffer 30. If the output of the comparator 26 is "1", which indicates that there is no error in the input data, the correction enable buffer 30 outputs a plurality of correction enable bits which are all "0". On the other hand, if the output generated by the comparator 26 is "0", which signifies that an error exists in the input data bits, the correction enable buffer 30 generates the correction enable bits identical to the decoded bits from the decoder 28.

FIG. 3 shows a logic circuit diagram of a Hamming code generator which can be used as the first or second block encoder 18 or 20 as shown in FIG. 2. The Hamming code generator as shown in FIG. 3 is capable of receiving an 8-bit byte input IN(7:0) and in response generates a coded 3-bit output BS(2:0) and a parity bit BP associated with the coded output bits BS(2:0). In the embodiment shown in FIG. 3, a plurality of XNOR gates 52, 54, 56, 58, 60, 62 and an XOR gate 64 are coupled to the input bits IN(7:0) in a first stage of logic gates. The XNOR gate 52 has inputs coupled to bits 4 and 5 of the input bits IN(7:0), and the XNOR gate 54 has inputs coupled to bits 6 and 7 of the input bits IN(7:0). The inputs of the XNOR gate 56 are coupled to bits 2 and 6, and the inputs of the XNOR gate 58 are coupled to bits 3 and 7 of the input bits IN(7:0). The inputs of the XNOR gate 60 are coupled to bits 1 and 3, and the inputs of the XNOR gate 62 are coupled to bits 5 and 7 of the input bits IN(7:0). The XOR gate 64 has inputs coupled to bits 0 and 4 of the input bits IN(7:0).

The Hamming code generator as shown in FIG. 3 further comprises a plurality of second-stage logic gates including a plurality of XNOR gates 66, 68, 70, 72 and an XOR gate 74. The XNOR gate 66 has inputs connected to the outputs of the XNOR gates 52 and 54 while the XNOR gate 68 has inputs connected to the outputs of the XNOR gates 56 and 58. The inputs of the XNOR gate 70 are connected to the outputs of the XNOR gates 60 and 62, while the inputs of the XNOR gate 72 are connected to the outputs of the XNOR gate 56 and the XOR gate 54. The second-stage XOR gate 74 has inputs connected to the outputs of the XNOR gates 60 and 62.

The outputs of the XNOR gates 66, 68 and 70 are coupled to inverters 76, 78 and 70, respectively, which generate the coded output bits BS(2:0). The outputs of the XNOR gate 72 and the XOR gate 74 are connected to a third-stage XNOR gate 82, which generates an output inverted by an inverter 84 to produce the parity bit BP. The parity bit BP and the coded output bits BS(2:0) are transmitted to the syndrome accumulator for convolutional operations to generate the syndrome.

The Hamming code generators for encoding an 8-bit input byte into a coded 3-bit output and generating an associated parity bit as shown in FIG. 3 and described above is only one of many possible embodiments for the data encoders 18 and 20 in the error correction circuit according to the present invention as shown in FIG. 2. Other error correction coding techniques can also be used which are within the scope of the present invention. Moreover, the inputs to the data encoders 18 and 20 as shown in FIG. 2 are not limited to 8-bit byte inputs. The data encoders 18 and 20 can be designed to accommodate pre-read input bits other than 8 bits.

Figure 4:
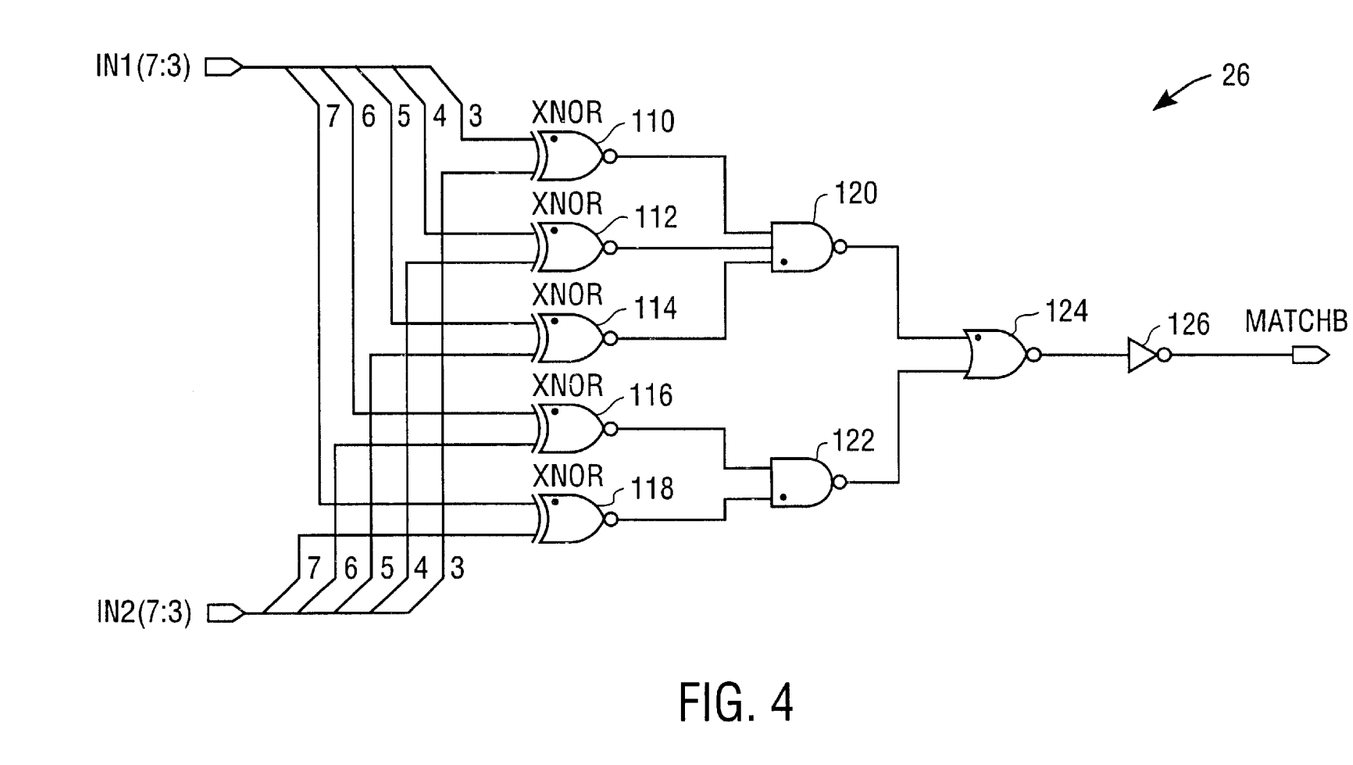
FIG. 4 shows a logic circuit diagram of an embodiment of a byte address comparator in the error correction circuit of FIG. 2.

FIG. 4 shows a logic circuit diagram of an embodiment of a byte address comparator 26 in the error correction circuit according to the present invention. The byte address comparator 26 has two 5-bit inputs IN1(7:3) and IN2(7:3), and outputs an output bit MATCHB depending upon whether the first input IN1(7:3) exactly matches the second input IN2(7:3). The byte address comparator as shown in FIG. 4 outputs a bit "0" if each of the bits in the input IN1(7:3) matches the corresponding bit in the input IN2(7:3), or an output bit "1" if there is a mismatch between any of the corresponding bits in the two inputs. One of the 5-bit inputs, such as IN1(7:3), may be connected to receive the data word byte address from the data word byte address generator 24 while the other input, such as IN2(7:3), may be connected to the syndrome latch 44 in FIG. 2 to receive the five high order bits of the syndrome bits.

Referring back to FIG. 4, the byte address comparator 26 comprises a plurality of XNOR gates 110, 112, 114, 116 and 118, NAND gates 120 and 122, a NOR gate 124 and an inverter 126. The XNOR gates 110, 112, 114, 116 and 118 each have two inputs coupled to receive a respective pair of input bits from the first and second inputs IN1(7:3) and IN2(7:3). The NAND gate 120 has three inputs connected to the outputs of the XNOR gates 110, 112 and 114 while the NAND gate 122 has two inputs connected to the outputs of the XNOR gates 116 and 118. The outputs of the NAND gates 120 and 122 are connected to the inputs of the NOR gate 124, the output of which is connected to an inverter 126. The output of the inverter 126 generates the output error signal MATCHB, which is either bit "0" if the two inputs IN1(7:3) and IN2(7:3) exactly match each other or bit "1" if there is any mismatch between the corresponding bits in the inputs IN1(7:3) and IN2(7:3). The byte address comparator 26 in the error correction circuit according to the present invention as shown in FIG. 2 is not limited to the logic circuit as shown in FIG. 4; other logic circuits can also be implemented to perform a comparison between the data word byte address and the byte error address.

Figure 5:
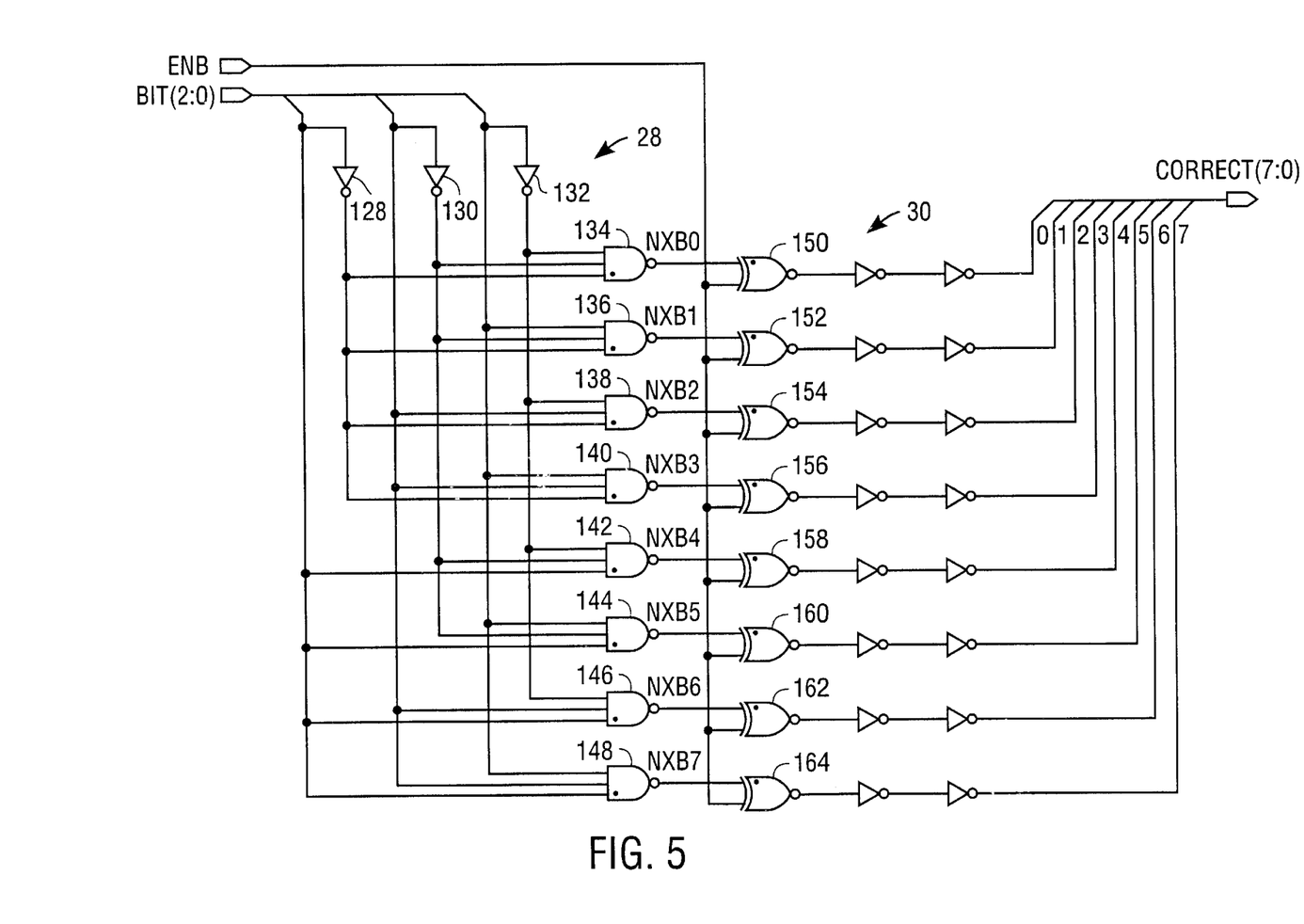
FIG. 5 shows a logic circuit diagram of an embodiment of a decoder combined with an error correction enable buffer in the error correction circuit of FIG. 2.

FIG. 5 is a logic diagram of an embodiment of a circuit which combines both the functions of the decoder 28 and of the error correction enable buffer 30 as shown in the block diagram of FIG. 2. Referring to FIG. 5, the decoder 28 has a 3-bit input BIT(2:0) and eight parallel outputs denoted as NXB0, NXB1, NXB2, . . . NXB7 for outputting the eight bits decoded from the three input bits BIT(2:0). The decoder 28 includes three inverters 128, 130 and 132 coupled to bits 2, 1 and 0 of the input BIT(2:0), respectively. The decoder 28 further comprises eight NAND gates 134, 136, 138, 140, 142, 144, 146 and 148 each having three inputs coupled to receive a different combination of non-inverted and inverted bits of the input bits BIT(2:0). The outputs NXB0, NXB1, NXB2, . . . NXB7 of the respective NAND gates 134, 136, 138, . . . 148 generate the decoded 8-bit output in response to receiving the coded input bits BIT (2:0).

The error correction enable buffer 30, which is coupled to receive the decoded bits from the decoder 28 and to receive the error correction enable signal ENB, which is the 1-bit output from the byte address comparator. The error correction enable buffer 30 comprises a plurality of NOR gates 150, 152, 154, 156, 158, 160, 162 and 164 each having two inputs, the first inputs connected to receive the error correction enable signal ENB and the second inputs connected to the outputs of the respective NAND gates 134, 136, 138, 140, 142, 144, 146 and 148 in the decoder 28. Each of the NOR gates 150, 152, 154, . . . 164 is connected to a cascade of two inverters which provide a time delay for the output of the respective NOR gate. The 8-bit output correction byte CORRECT(7:0) includes bits 0, 1, 2, . . . 7, which are the same as bits generated by the outputs of the respective NOR gates 150, 152, 154, . . . 164. The error correction circuit output COR.ENB as shown in FIG. 1 transmits the error correction byte CORRECT(7:0) from the error correction circuit 4 to the input-output multiplexer buffer 6.

The present invention provides a method of error correction for a memory device with a relatively short external data access time delay while reducing the cost and complexity of hardware. The method is applicable to the operation of the memory device and the error correction circuit as shown in FIGS. 1 and 2, although it is not limited to any particular hardware configuration. The error correction method generally comprises the steps of:

(a) pre-reading a data word comprising a plurality of bytes identified by a plurality of data word byte addresses, comprising the step of counting the bytes of the data word to generate a plurality of byte ordinals for the bytes in the data word;

(b) coding the data word to generate a code word;

(c) generating a syndrome based upon the code word, the byte ordinals and the data word, the syndrome comprising a byte error address and a bit error address;

(d) comparing the data word byte address with the byte error address to determine whether the data word byte address matches the byte error address;

(e) generating an error correction enable signal in response to a determination by the step of comparing the data word byte address with the byte error address that the data word byte address matches the byte error address;

(f) decoding the bit error address to generate a decoded bit error address; and (g) generating an error corrected byte based upon the decoded bit error address in response to the error correction enable signal.

In a further embodiment, the method according to the present invention is applicable to the error correction of a plurality of data words in a memory page which is pre-read from the memory array. In this embodiment, a second data word may be pre-read by the error correction circuit while the first data word within the same memory page is being read by the memory, and the second data word may be coded to generate a second code word while the first data word is being corrected and read.

In an embodiment, each memory page is divided into three groups of data and error correction words of different lengths. The first group includes 10 data words each comprising 20 bytes. The second group, which is subsequent to the first group of data words in sequence, includes 13 data words each comprising 24 bytes. The last group, which is subsequent to the second group of data words in sequence, includes a single word having a length of 16 bytes for error correction. Other arrangements of data and error correction words can also be used for error correction of data bytes within the scope of the present invention.

In an embodiment in which a plurality of data words are pre-read from the memory array to the error correction circuit for correcting errors, if any, in the data words, the method steps as described above may be repeated for each of the data words within each memory page. The data bytes of the second data word and any additional data words within the memory page are counted, renumbered and rearranged into a plurality of even and odd bytes, the counter bits of which are transmitted to the syndrome accumulator 22 through the 5-bit and 4-bit channels 32 and 34, respectively. The renumbered and rearranged byte ordinals are represented in a binary format comprising a plurality of counter bits, for example, five counter bits as listed in Table A above, at least two of the counter bits having a binary 1. The renumbered byte ordinals may be rearranged into the odd and even bytes according to Tables B and C above.

The step of coding each of the data words may be achieved by using a conventional error correcting block code such as a Hamming code. Block encoding by using a Hamming code is well known to a person skilled in the art. An example of a Hamming code generator is shown in FIG. 3, although the error correction scheme according to the present invention is not limited to the Hamming code. Furthermore, the output from the syndrome accumulator 22 as described above is an 8-bit output consisting of a 5-bit byte error address and a 3-bit bit error address, with a byte error address bits being the higher order bits and the bit error address bits being the lower order bits. The syndrome accumulator 22, which performs syndrome calculations based upon an error correcting block code such as a Hamming code used by the data encoders 18 and 20, generates a syndrome vector for each data byte and accumulates the syndrome vectors. The syndrome accumulator performs convolutional operations to accumulate the syndromes for the data bytes with inputs from the Hamming encoders 18 and 20 and the data word byte address generator 24.

Advantageously, the error correction method according to the present invention can be performed on a memory array with a reduced delay in the external data access time compared to conventional serial processing methods for error correction. Instead of requiring hundreds of cycles of delay in the external data access time resulting from conventional serial processing of data for error correction, the method according to the present invention is able to reduce the number of delay cycles in the external data access time. Compared to conventional parallel processing of data for error correction which requires a large number of logic gates, the method according to the present invention can be performed with an error correction circuit that has a relatively small number of logic gates. Therefore, the error correction method according to the present invention can be performed with simpler and less expensive hardware architecture than that which is required for conventional parallel processing while reducing the external data access time delay caused by conventional serial processing.

INDUSTRIAL APPLICABILITY

The present invention is applicable to the error correction of data in a memory device, and more particularly, to the error correction of data in a flash memory device. The present invention is also applicable to the error correction of data in other memory devices, such as random access memory devices, magnetic storage devices and optical storage devices. All of the components of the error correction circuit described above may be integrated with the memory array on a single semiconductor integrated circuit chip. Alternatively, some or all of the components of the error correction circuit may be implemented on one or more integrated circuits external to the memory array. However, the method according to the present invention is not limited to the circuits as shown in FIGS. 1–5 and described above. Various physical implementations of the error correction method can be realized which are within the scope of the present invention.

The invention has been described with respect to particular embodiments thereof, and numerous modifications can be made which are within the scope of the invention as set forth in the claims.

What is claimed is:

1. A method of correcting an error, comprising the steps of:
    (a) pre-reading a data word comprising a plurality of bytes identified by a plurality of data word byte addresses, comprising the step of counting the bytes of the data word to generate a plurality of byte ordinals for the bytes in the data word;
    (b) coding the data word to generate a code word;
    (c) generating a syndrome based upon the code word, the byte ordinals and the data word, the syndrome comprising a byte error address and a bit error address;
    (d) comparing the data word byte address with the byte error address to determine whether the data word byte address matches the byte error address;
    (e) generating an error correction enable signal in response to a determination by the step of comparing the data word byte address with the byte error address that the data word byte address matches the byte error address;
    (f) decoding the bit error address to generate a decoded bit error address; and
    (g) generating an error corrected byte based upon the decoded bit error address in response to the error correction enable signal.

2. The method of claim 1 for a memory page which includes at least a first data word and a second data word, further comprising the steps of:
    (a2) pre-reading the second data word when the first data word is being read; and
    (b2) coding the second data word to generate a second code word.

3. The method of claim 2, wherein the memory page comprises a first group of 10 words, a second group of 13 words subsequent in sequence to the first group of words, and a last word subsequent in sequence to the second group of words.

4. The method of claim 3, wherein each of the words in the first group comprises 20 bytes.

5. The method of claim 4, wherein each of the words in the second group comprises 24 bytes.

6. The method of claim 5, wherein the last word comprises 16 bytes.

7. The method of claim 1, further comprising the step of repeating steps (a)–(g) for correcting a plurality of errors in a plurality of data words in a page of memory.

8. The method of claim 1, wherein the step of coding the data word comprises the step of coding the data word by using a block code.

9. The method of claim 8, wherein the block code comprises a Hamming code.

10. The method of claim 1, wherein the byte error address consists of 5 bits and the bit error address consists of 3 bits.

11. The method of claim 1, wherein the byte ordinals are represented in a binary format comprising a plurality of counter bits, at least two of the counter bits having a binary 1.

12. The method of claim 1, wherein the step of pre-reading the data word further comprises the step of rearranging the byte ordinals into a plurality of even bytes and a plurality of odd bytes.

13. A method of correcting an error, comprising the steps of:
- (a) pre-reading a data word comprising a plurality of bytes identified by a plurality of data word byte addresses, comprising the steps of:
  - (i) counting the bytes of the data word to generate a plurality of byte ordinals for the bytes in the data word, the byte ordinals represented in a binary format comprising a plurality of counter bits, at least two of the counter bits having a binary 1; and
  - (ii) rearranging the byte ordinals into a plurality of even bytes and a plurality of odd bytes;
- (b) coding the data word to generate a code word;
- (c) generating a syndrome based upon the code word, the even and odd bytes of the byte ordinals and the data word, the syndrome comprising a byte error address and a bit error address;
- (d) comparing the data word byte address with the byte error address to determine whether the data word byte address matches the byte error address;
- (e) generating an error correction enable signal in response to a determination by the step of comparing the data word byte address with the byte error address that the data word byte address matches the byte error address;
- (f) decoding the bit error address to generate a decoded bit error address; and
- (g) generating an error corrected byte based upon the decoded bit error address in response to the error correction enable signal.

14. The method of claim 13 for a memory page which includes at least a first data word and a second data word, further comprising the steps of:
- (a2) pre-reading the second data word when the first data word is being read; and
- (b2) coding the second data word to generate a second code word.

15. The method of claim 14, wherein the memory page comprises a first group of 10 words, a second group of 13 words subsequent in sequence to the first group of words, and a last word subsequent in sequence to the second group of words.

16. The method of claim 15, wherein each of the words in the first group comprises 20 bytes.

17. The method of claim 16, wherein each of the words in the second group comprises 24 bytes.

18. The method of claim 17, wherein the last word comprises 16 bytes.

19. The method of claim 13, further comprising the step of repeating steps (a)–(g) for correcting a plurality of errors in a plurality of data words in a page of memory.

20. The method of claim 13, wherein the step of coding the data word comprises the step of coding the data word by using a block code.

21. The method of claim 20, wherein the block code comprises a Hamming code.

22. The method of claim 13, wherein the byte error address consists of 5 bits and the bit error address consists of 3 bits.

23. A method of correcting an error, comprising the steps of:
- (a) reading a data page which comprises a first data word and at least one second data word subsequent in sequence to the first data word, each of the data words comprising a plurality of bytes identified by a plurality of corresponding data word byte addresses, the step of reading the data page comprising the steps of:
  - (i) pre-reading the second data word when the first data word is being read;
  - (ii) coding each of the data words to generate a respective code word;
  - (iii) counting the bytes of each of the data words to generate a plurality of byte ordinals for the bytes in each of the data words, the byte ordinals represented in a binary format comprising a plurality of counter bits, at least two of the counter bits having a binary 1; and
  - (iv) rearranging the byte ordinals into a plurality of even bytes and a plurality of odd bytes;
- (b) generating a syndrome for each of the data words based upon the data words, the code words, and the even and odd bytes of the byte ordinals, the syndrome comprising a byte error address and a bit error address;
- (c) comparing the data word byte address with the byte error address to determine whether the data word byte address matches the byte error address;
- (d) generating an error correction enable signal in response to a determination by the step of comparing the data word byte address with the byte error address that the data word byte address matches the byte error address;
- (e) decoding the bit error address to generate a decoded bit error address; and
- (f) generating an error corrected byte based upon the decoded bit error address in response to the error correction enable signal.

24. The method of claim 23, wherein the memory page comprises a first group of 10 words, a second group of 13 words subsequent in sequence to the first group of words, and a last word subsequent in sequence to the second group of words.

25. The method of claim 24, wherein each of the words in the first group comprises 20 bytes.

26. The method of claim 25, wherein each of the words in the second group comprises 24 bytes.

27. The method of claim 26, wherein the last word comprises 16 bytes.

28. The method of claim 23, further comprising the step of repeating steps (a)–(f) for correcting a plurality of errors in a plurality of data words.

29. The method of claim 23, wherein the step of coding each of the data words comprises the step of coding each of the data words by using a block code.

30. The method of claim 29, wherein the block code comprises a Hamming code.

31. The method of claim 23, wherein the byte error address consists of 5 bits and the bit error address consists of 3 bits.

32. A method of correcting an error, comprising the steps of:
- (a) reading a data page which comprises a first data word and at least one second data word subsequent in sequence to the first data word, each of the data words comprising a plurality of bytes identified by a plurality of corresponding data word byte addresses, the step of reading the data page comprising the steps of:
  - (i) pre-reading the second data word when the first data word is being read;
  - (ii) coding each of the data words to generate a respective code word;
  - (iii) counting the bytes of each of the data words to generate a plurality of byte ordinals for the bytes in each of the data words, the byte ordinals represented in a binary format comprising a plurality of counter bits, at least two of the counter bits having a binary 1; and (iv) rearranging the byte ordinals into a plurality of even bytes and a plurality of odd bytes;

(b) generating a syndrome for each of the data words based upon the data words, the code words, and the even and odd bytes of the byte ordinals, the syndrome comprising a byte error address and a bit error address;

(c) comparing the data word byte address with the byte error address to determine whether the data word byte address matches the byte error address;

(d) generating an error correction enable signal in response to a determination by the step of comparing the data word byte address with the byte error address that the data word byte address matches the byte error address;

(e) decoding the bit error address to generate a decoded bit error address; and (f) generating an error corrected byte based upon the decoded bit error address in response to the error correction enable signal.

33. The method of claim 32, wherein the memory page comprises a first group of 10 words, a second group of 13 words subsequent in sequence to the first group of words, and a last word subsequent in sequence to the second group of words.

34. The method of claim 33, wherein each of the words in the first group comprises 20 bytes.

35. The method of claim 34, wherein each of the words in the second group comprises 24 bytes.

36. The method of claim 35, wherein the last word comprises 16 bytes.

37. The method of claim 32, further comprising the step of repeating steps (a)–(f) for correcting a plurality of errors in a plurality of data words.

38. The method of claim 32, wherein the step of coding each of the data words comprises the step of coding each of the data words by using a block code.

39. The method of claim 38, wherein the block code comprises a Hamming code.

40. The method of claim 32, wherein the byte error address consists of 5 bits and the bit error address consists of 3 bits.

* * * * *